United States Patent
Ota et al.

[11] Patent Number: 5,220,353
[45] Date of Patent: Jun. 15, 1993

[54] THERMAL PRINT HEAD

[75] Inventors: Shigeo Ota; Yasushi Ema, both of Kyoto, Japan

[73] Assignee: Rohm Co., Ltd., Kyoto, Japan

[21] Appl. No.: 802,193

[22] Filed: Dec. 4, 1991

[30] Foreign Application Priority Data

Dec. 19, 1990 [JP] Japan ............................ 2-403982[U]
Dec. 26, 1990 [JP] Japan ............................ 2-404989[U]
Dec. 28, 1990 [JP] Japan ............................ 2-405603[U]
Nov. 12, 1991 [JP] Japan ................................. 3-295414

[51] Int. Cl.[5] ............................................ B41J 2/335
[52] U.S. Cl. ............................................. 346/76 PH
[58] Field of Search ................... 346/76 PH; 219/543

[56] References Cited

U.S. PATENT DOCUMENTS 4,555,715  11/1985  Vegeais ........................ 346/76 PH
4,963,886  10/1990  Fukuda et al. ................ 346/76 PH

FOREIGN PATENT DOCUMENTS 083419    7/1983  European Pat. Off. .
59-215874 12/1984  Japan .
60-141256  9/1985  Japan .
63-25057   2/1988  Japan .
63-111064  5/1988  Japan .
63-92751   6/1988  Japan .

OTHER PUBLICATIONS

Karsch et al, "Removable Printhead Mount", IBM Technical Disclosure Bulletin, vol. 23, No. 9 (Feb. 1981).

Primary Examiner—Benjamin R. Fuller
Assistant Examiner—Huan Tran
Attorney, Agent, or Firm—William H. Eilberg

[57] ABSTRACT

A thermal print head includes a head circuit board, a flattened flexible member partially overlapped on the head circuit board for electrical connection thereto in a limited region which is sufficiently smaller in length than the head circuit board, and a pressure applying member for pressing the flexible member into contact with the head circuit board in the limited region. The pressure applying member is in the form of a plate spring having a presser portion which is elastically deformed for pressing the flexible member into contact with the head circuit board in the limited region by elastic restoring force of the spring.

11 Claims, 9 Drawing Sheets

THERMAL PRINT HEAD

BACKGROUND OF THE INVENTION

1. Field of the Invention

This invention relates to a thermal print head which is used in a facsimile machine or printer for example. More specifically, the present invention relates to a line-type thermal print head which has a line of heating dots with a length for sufficiently covering the entire width of paper being printed.

2. Description of the Prior Art

A line-type thermal print head is conventional and disclosed for example in Japanese Utility Model Laid-open No. 60-141256 and 63-92751. The name "line-type thermal head" is given because it includes a multiplicity of heating dots disposed in a line arrangement.

Specifically, the line-type thermal head disclosed in either of the above-described Japanese publications comprises a head circuit board on which the line of heating dots is formed to extend longitudinally thereof. The head circuit board further carries a longitudinal array of drive IC's for driving the heating dots, and a conductor pattern which includes connection terminals arranged substantially over the entire length of the head circuit board.

The line-type thermal head further comprises a metallic support member for supporting the head circuit board thereon and for dissipating the heat therefrom during operation. A flexible connector board carrying a conductor pattern is partially overlapped on the head circuit board. Further, a presser cover arranged above the connector board is fixed to the support member by a plurality of bolts screwed in the support member for covering the array of drive IC's for protection. The underside of the presser cover is provided with a groove which receives a separate elastic rod for pressing the connector board into contact with the head circuit board when the bolts are tightened up.

According to the above-described arrangement, the connection terminals are distributed substantially over the entire length of the head circuit board. Thus, the presser cover need be bolted to the support member substantially over the entire length of the head circuit board, so that the presser cover and the support member cannot linearly expand independently of each other under heating. This results in that the thermal head is subjected to thermal bending due to the so-called "bi-metal phenomenon", consequently causing deterioration of the printing quality.

Further, the conventional thermal print head is also disadvantageous in the following points.

(1) The separate elastic rod need be fitted in the groove of the presser cover at the time of assembling the thermal head. Thus, it is relatively time-taking to assemble the thermal head, which results in increase of the cost. Further, the use of the elastic rod adds to the total number of required components.

(2) The presser cover is a thick and rigid member which must be made by extrusion for example. Thus, the cost for making the presser member is relatively high. Further, the use of the presser cover adds greatly to the overall weight of the thermal head.

(3) To realize uniform contact between the flexible connector board and the head circuit board, the tightening force of all the bolts must be strictly controlled. Such necessity also adds greatly to the cost of the thermal head.

U.S. Pat. No. 4,963,886 to Fukuda et al discloses another line-type thermal print head wherein the problematic thermal bending is prevented or reduced by arranging the connection terminals of the head circuit board in a limited central portion thereof while allowing the support member and the presser cover to linearly expand independently of each other at both ends of the thermal head. Although the problem of thermal bending is effectively prevented, the thermal head of this U.S. patent stills has the disadvantages (1)-(3) discussed above.

SUMMARY OF THE INVENTION

It is, therefore, an object of the invention to provide a thermal print head which is simpler and lighter than the prior art thermal heads, and which can be manufactured and assembled very easily at a reduced cost Another object of the present invention is to provide a thermal print head which can be assembled without using any bolts to realize further reduction of the assembling cost.

According to the present invention, there is provided a thermal print head comprising a head circuit board formed with a resistor line and at least one array of drive elements, the head circuit board being further formed with connection terminals for the resistor line and the array of drive elements, the connection terminals being arranged locally at least in one region which is sufficiently smaller in length than the head circuit board; a flattened flexible member formed with a conductor pattern for electrical connection to the connection terminals of the head circuit board, the flexible member being partially overlapped on the head circuit board in said one region thereof; and a pressure applying member for pressing the flexible member into contact with the head circuit board in said one region thereof; wherein the pressure applying member comprising a plate spring having a presser portion which is elastically deformed for pressing the flexible member into contact with the head circuit board in said one region thereof by elastic restoring force of the spring.

According to the arrangement described above, the elastic force of the pressure applying plate spring itself is utilized for pressing the flexible member (flexible connector board or band-like flexible cable) into intimate and uniform contact with the head circuit board. Thus, no separate elastic member (e.g. the elastic rod disclosed in U.S. Pat. No. 4,963,886) need be provided, so that the time and labor required for assembling the thermal head can be greatly reduced. Further, the plate spring may be made simply by press-working a sheet metal, so that the cost and weight of the thermal head may be greatly reduced.

The plate spring may be fixed to a support member for the head circuit board by means of bolts screwed into the support member. In such an arrangement, the tightening force of the bolts need not be controlled strictly due to the utilization of the elastic force of the plate spring. Thus, the time required for mounting the plate spring can be greatly reduced in comparison with the prior art wherein the bolts for the presser cover need be tightened in a strictly controlled manner.

Alternatively, the plate spring may be in the form of a clip which is mounted to a combined assembly of the flexible member and head circuit board (optionally plus the support member) without using any bolts. This arrangement enables even easier assembly of the thermal head.

Preferably, the presser portion of the plate spring may be formed with cuts or slits extending transversely of the head circuit board for division into segments which are elastically deformable independently of each other. Such an arrangement always insure substantially uniform contact between the flexible member and the head circuit board even if one or both of these two members are irregular in thickness along the length thereof.

Other objects, features and advantages of the present invention will be fully understood from the following detailed description given with reference to the accompanying drawings

BRIEF DESCRIPTION OF THE DRAWINGS

In the accompanying drawings:

FIG. 1a is a side view showing a pressure applying spring incorporated in the thermal print head of FIG. 1;

DETAILED DESCRIPTION

Figure 1:
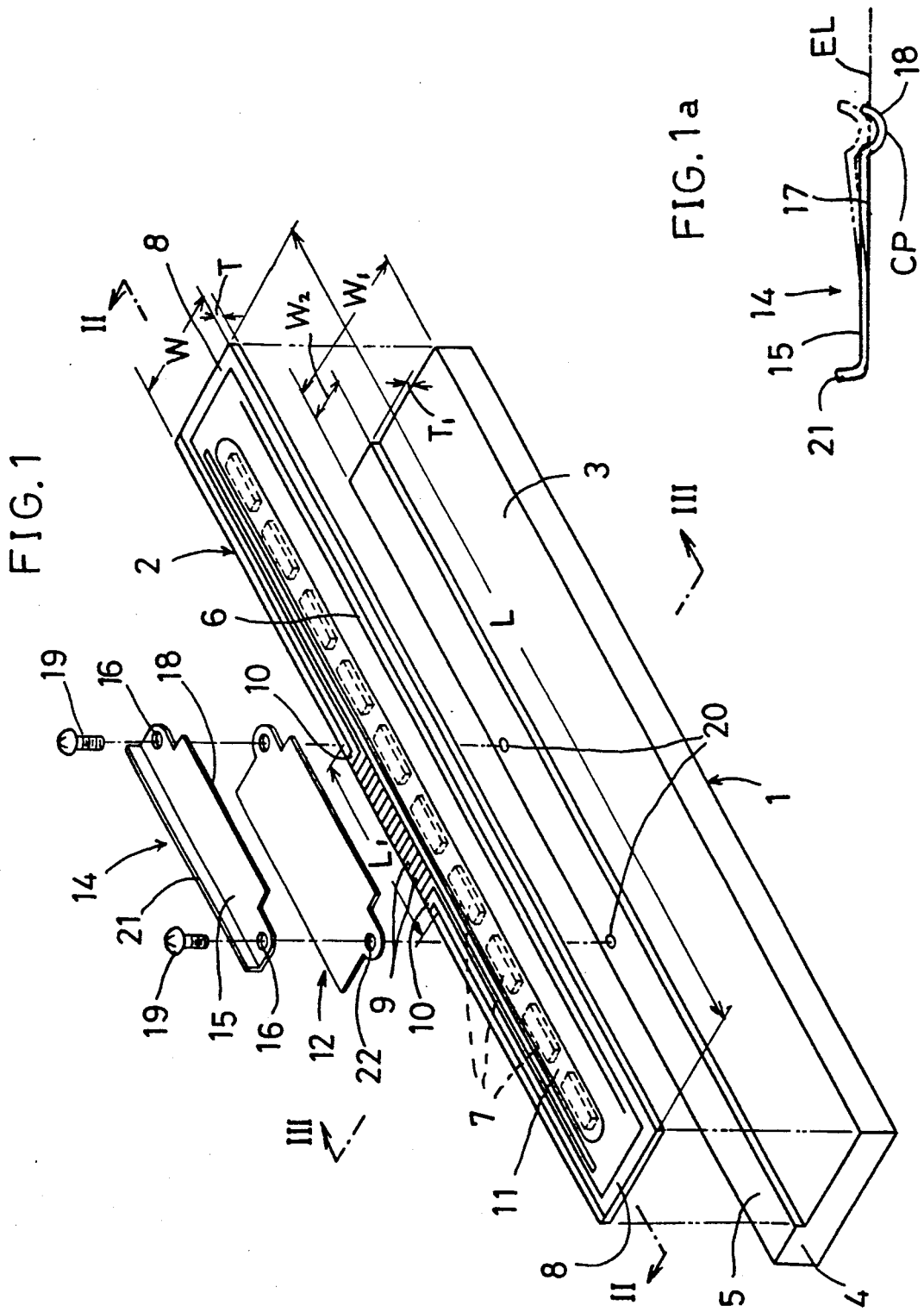
FIG. 1 is an exploded perspective view showing a thermal print head according to a first embodiment of the invention.

Throughout the accompanying drawings, like parts are designated by the same reference numerals and characters FIGS. 1 through 5 show a line-type thermal print head according to a first embodiment of the present invention. The print head mainly comprises an elongate support plate 1, an elongate head circuit board 2 mounted on the support plate 1, a flexible connector board 12 partially overlapped over the head circuit board 2, and a pressure applying member 14 for pressing, from above, the flexible connector board 12 into intimate contact with the head circuit board 2.

Figure 3:
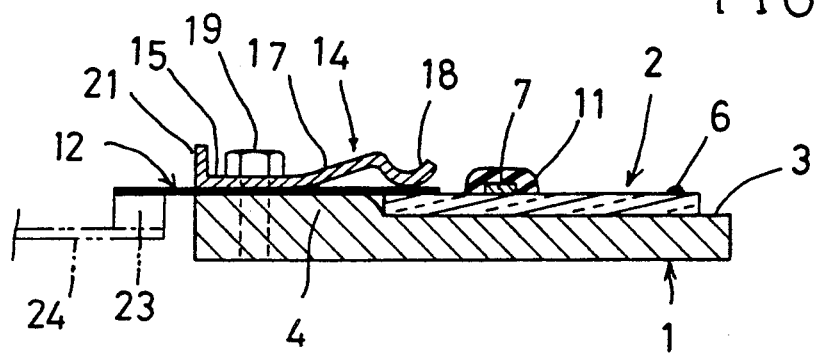
FIG. 3 is a sectional view taken along lines III—III in FIG. 1 to show the thermal head in its assembled state.

The support plate 1 is made of aluminum for example and works also as a heat sink. As shown in FIG. 1, the support plate has a width W1 which is larger than the width W of the head circuit board 2 by an amount W2. The support plate provides an upper support surface 3 on which the head circuit board 2 is placed. The support plate also has an excess marginal portion 4 which extends beyond the upper support surface 3 (and the head circuit board 2 supported thereon). The excess marginal portion 4 provides a raised surface 5 which is higher than the support surface 3 by an amount T1 corresponding to the thickness T of the head circuit board 2. Thus, when the head circuit board 2 is placed on the support surface 3, the raised surface 5 becomes flush with the upper surface of the head circuit board 2, as best shown in FIG. 3.

Figure 2:
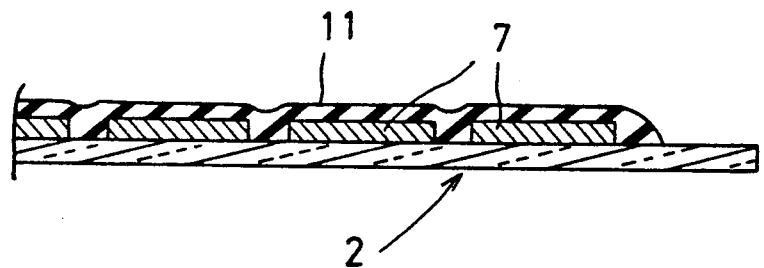
FIG. 2 is a sectional view taken along lines II—II in FIG. 1.

The head circuit board 2 carries a heating resistor line 6 extending longitudinally thereof to provide a line of multiple heating dots. The head circuit board also carries a longitudinal array of drive IC's 7 for divisionally heating the resistor line 6. The array of drive IC's 7 is completely enclosed in an elongate protective body 11 made of relatively hard synthetic resin (e.g. epoxy resin) , as shown in FIGS. 2 and 3.

Further, the upper surface of the head circuit board 2 is formed with a conductor pattern which includes a common electrode 8 extending along the respective edges of the circuit board, connection terminals 9, and other pattern elements such as individual electrodes (not shown). The common electrode 8 has a pair of connection terminals 10 which constitute a comb-like arrangement together with the other connection terminals 9. These connection terminals 9, 10 are used for receiving drive power and various signals (e.g. clock signals, latch signals and so on) from the exterior. According to the illustrated embodiment, the connection terminals 9, 10 are disposed locally in a limited central portion whose length L1 is sufficiently smaller than the overall length L of the head circuit board.

Figure 4:
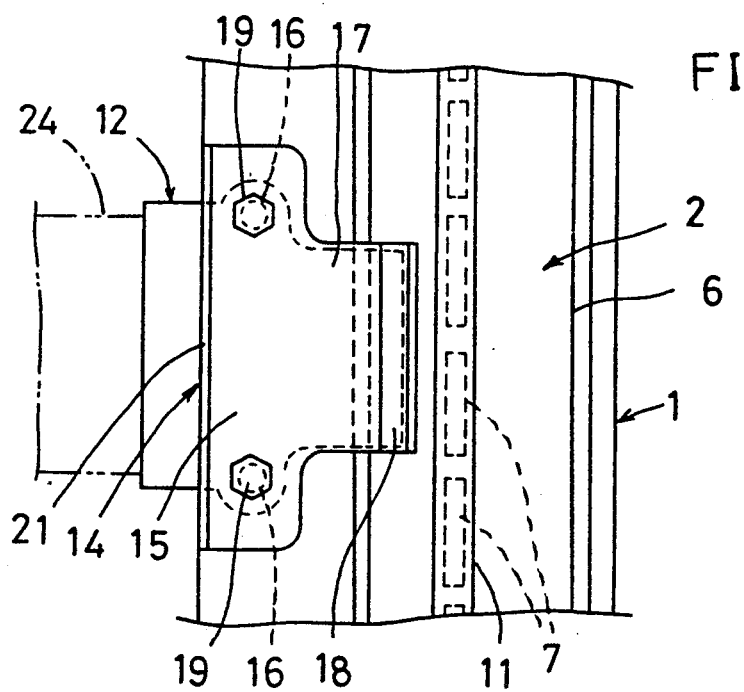
FIG. 4 is a plan view showing the same thermal head.
Figure 5:
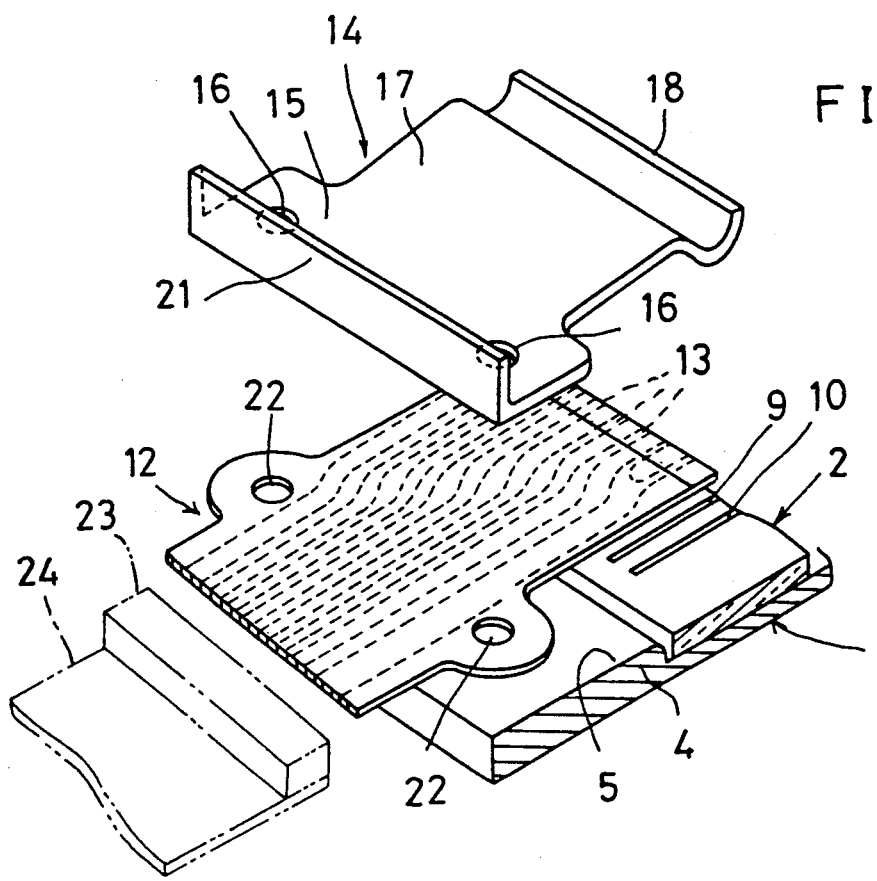
FIG. 5 is a fragmentary perspective view showing a principal portion of the same thermal head in its exploded state.

The flexible connector board 12 is formed with a wiring conductor pattern 13 (see FIG. 5) for electrical connection to the connection terminals 9, 10 of the head circuit board 2. In assembly, the connector board 12 rests on the raised surface 5 of the support member 1 but project beyond the raised surface 5 to partially overlap the head circuit board 2 in the central portion L1 thereof, as best shown in FIG. 3. Obviously, the raised surface 5 of the support member 1 provides a support for the connector board 12, so that no separate reinforcing backing is required for the connector board in spite of its flexibility. As shown in FIGS. 3 through 5, the underside of the connector board 12 carries a connector 23 which is removably connected to a band-like flexible cable 24 for electrical conduction.

As better shown in FIGS. 3 through 5, the pressure applying member 14 according to the first embodiment is in the form of a plate spring having a base portion 15 provided with a pair of mounting holes 16. The base portion 15 is also provided with a reinforcing rib 21 which is formed by upwardly bending a margin of the base portion. The pressure applying spring 14 further has an integral extension 17 formed with a rounded presser tip portion 18 for pressing the overlapping portion of the flexible connector board 12 into intimate contact with the head circuit board 2 in the central portion L1 thereof. The presser tip portion 18 is rounded to avoid damage to the flexible connector board 12 due to direct contact therewith.

For the purpose of mounting the pressure applying spring 14, a pair of perforations 22 are formed in the flexible connector board 12 in corresponding relation to the mounting holes 16 of the pressure applying spring, and a pair of threaded holes 20 are formed in the excess marginal portion 4 of the support member 1 again in corresponding relation to the spring mounting holes 16. Bolts 19 are inserted through the mounting holes 16 and the perforations 22 into engagement with the threaded holes 20.

In natural state, the base portion 15 and integral extension 17 of the pressure applying spring 14 are contained in a same plane EL, as indicated by solid lines in FIG. 1a. However, as the bolts 15 are tightened up, the pressure applying spring 14 is elastically deformed. As a result, the integral extension 17 deviates from the plane EL of the base portion 15, as indicated by phantom lines in FIG. 1a. Instead, a contact line CP provided by the rounded presser tip portion 18 will be located in the plane of the base portion 15.

In this way, the elastic restoring force of the pressure applying spring 14 can be effectively utilized for causing the rounded presser tip portion 18 to press the conductor pattern 13 of the flexible connector board 12 into uniform and intimate contact with the respective connection terminals 9, 10 of the head circuit board 2. According to the illustrated first embodiment, the following advantages are also obtainable in addition to this basic advantage.

(1) The pressure applying plate spring 14 may be made relatively thin for positive utilization of its elasticity. Thus, the plate spring can be made by press-working a sheet metal at a lower cost than a rigid aluminum presser cover which must be made by extrusion or forging. Further, the overall thickness and weight of the thermal print head can be correspondingly reduced.

(2) Since the elastic restoring force of the plate spring 14 is positively utilized for pressure application, the bolts 19 for mounting the spring 14 need only be tightened up until the base portion 15 of the spring comes into intimate contact with the flexible connector board 12. Thus, the tightening force of the bolts 19 need not be strictly controlled, so that the plate spring 14 can be mounted extremely easily.

(3) Since the elastic restoring force of the plate spring 14 itself is utilized for pressure application, no separate elastic member is needed (cf. the elastic rod of U.S. Pat. No. 4,963,886). Thus, the total number of required components can be reduced, and the time and labor required for assembly are also reduced correspondingly for production cost reduction.

(4) The reinforcing rib 21 increases the rigidity of the base portion 15 of the plate spring 14. This reinforcing rib prevents warping (lifting) of the spring base portion 15 at a position between the bolts 19 at the time of elastically deforming the spring 14 (see FIG. 1a). As a result, the plate spring 14 is rendered capable of providing even more uniform pressure application relative to the connector board 12.

(5) The support member 1 itself has a raised surface 5 to provide a support for the flexible connector board 12. Thus, no separate backing or reinforcement is needed for the connector board, thereby reducing the total number of required components.

Figure 6:
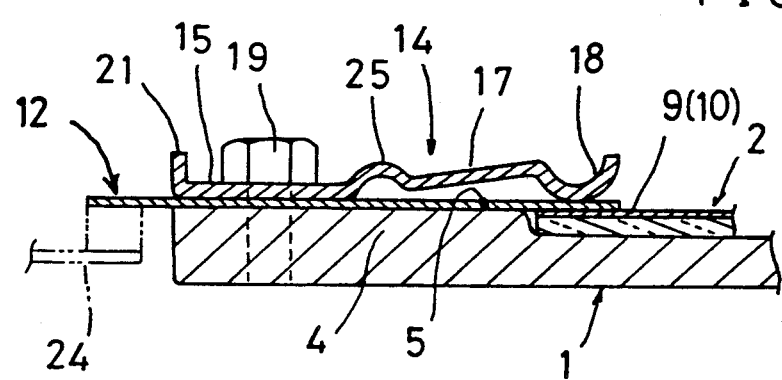
FIG. 6 is a sectional view similar to FIG. 3 but showing a thermal print head which incorporates a pressure applying spring according to a second embodiment of the invention.

FIG. 6 shows a thermal print head according to a second embodiment of the present invention. The second embodiment differs from the first embodiment only in that the pressure applying plate spring 14 additionally has a reinforcing bulge 25 extending longitudinally of the support member 1. The reinforcing bulge 25 is positioned between the base portion 15 and the integral extension 17.

Obviously, the reinforcing bulge 25 provided in the second embodiment cooperates with the reinforcing rib 21 to further increase the rigidity of the spring base portion, thereby effectively preventing warping (lifting) at an intermediate position between the bolts 19 to enable uniform contact between the flexible connector board 12 and the head circuit board 2. Of course, the reinforcing bulge 25 alone is effective for reinforcement, so that the reinforcing rib 21 may be dispensed with.

Figure 7:
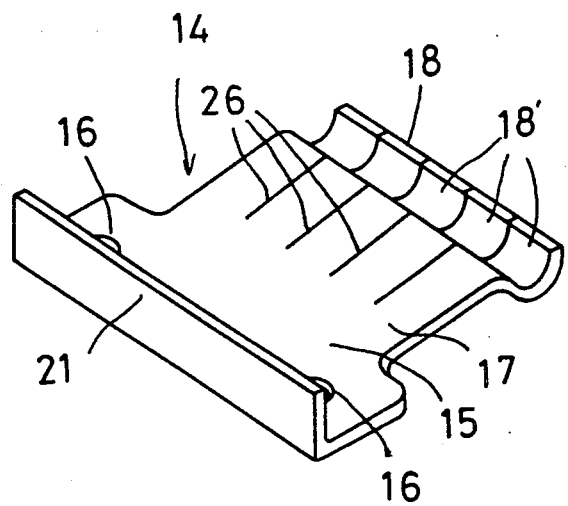
FIG. 7 is a perspective view showing a pressure applying spring according to a third embodiment of the invention.

FIG. 7 illustrates a pressure applying plate spring 14 according to a third embodiment of the present invention. The plate spring 14 of this embodiment differs from that of the first embodiment only in that the integral extension 17 is formed with a plurality of cuts 26 to divide the integral extension 17 together with the presser tip portion 18 into segments 18' which are elastically deformable independently of each other.

According to the third embodiment, independent deformability of the respective divided segments 18' insures substantially uniform contact between the flexible connector board 12 (namely, the conductor pattern 13 shown in FIG. 5) and the head circuit board 2 (namely, the connection terminals 9, 10) even if the flexible connector board 12 and/or the head circuit board 2 are irregular in thickness longitudinally thereof. Thus, it is possible to always obtain reliable electrical connection between the flexible connector board 12 and the head circuit board 2.

Figure 8:
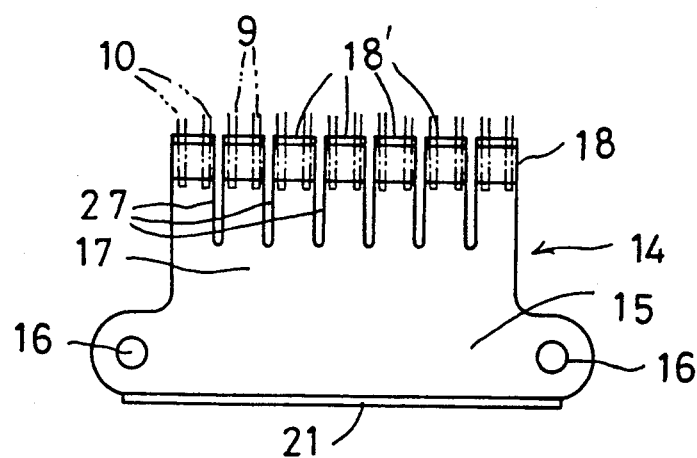
FIG. 8 is a plan view showing a pressure applying spring according to a fourth embodiment of the invention.

FIG. 8 shows a pressure applying plate spring 14 according to a fourth embodiment of the present invention. The plate spring 14 of this embodiment differs from that of the third embodiment only in that the cuts 26 shown in FIG. 7 are replaced by slits 27. Obviously, the fourth embodiment enjoys the same advantage as the third embodiment.

Figure 9:
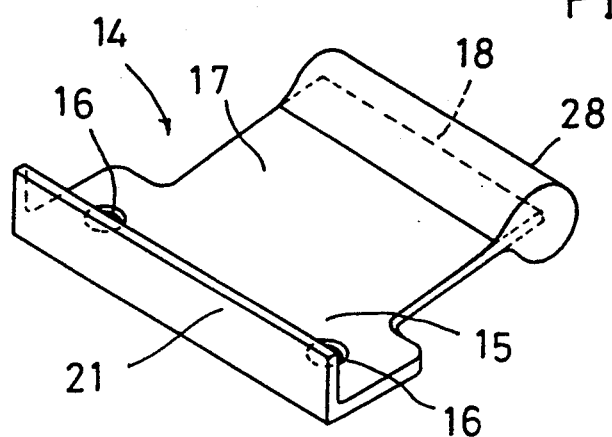
FIG. 9 is a perspective view showing a pressure applying spring according to a fifth embodiment of the invention.

FIG. 9 shows a pressure applying plate spring 14 according to a fifth embodiment of the present invention. According to this embodiment, the plate spring 14 has a presser tip portion 18 enclosed in a relatively soft elastic body 28 which is made of rubber for example. The elastic body 28 is irremovably attached to the presser tip portion 18 by molding in situ with the tip portion 18. Thus, the elastic body 28 is substantially integral with the presser tip portion 18 and therefore does not constitute an additional element, as opposed to the separate rubber rod disclosed in U.S. Pat. No. 4,963,886.

Obviously, the elastic body 28 provides a soft contact relative to the flexible connector board 12 (see FIG. 3 for example) without likelihood of damaging it. Further, the elastic body 28 can easily follow the surface irregularities of the flexible connector board 12, thereby insuring reliable electrical connection between the flexible connector board 12 and the head circuit board 2.

Figure 10:
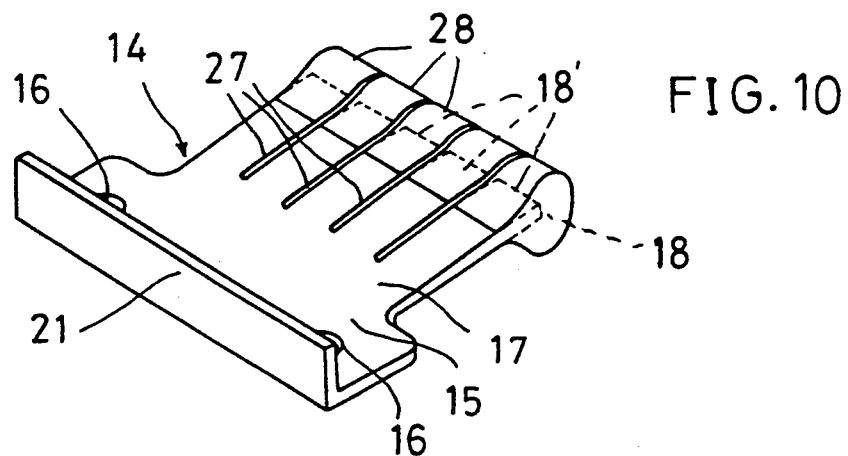
FIG. 10 is a perspective view showing a pressure applying spring according to a sixth embodiment of the present invention.
Figure 11A:
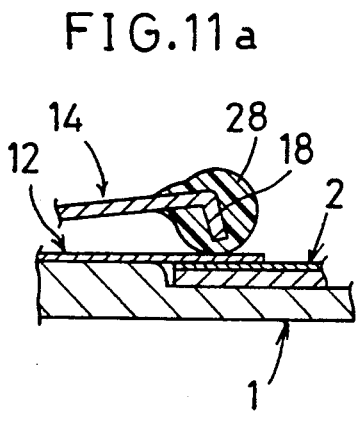
FIGS. 11a is a sectional view showing a pressure applying spring according to a seventh embodiment of the present invention.
Figure 11B:
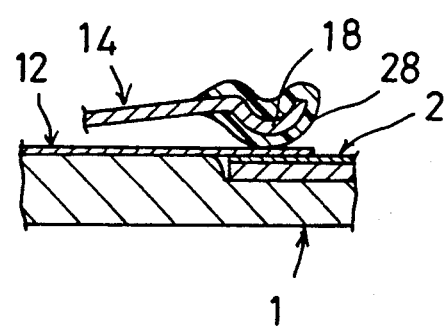
FIG. 11b is a sectional view similar to FIG. 11a but showing a pressure applying spring according to an eighth embodiment of the present invention.

Similarly to the third and fourth embodiments shown in FIGS. 7 and 8, the integral extension 17 of the pressure applying plate spring 14 together with the elastic body 28 may be divided by a plurality of slits 27 (or alternatively, cuts), as shown in FIG. 10 (sixth embodiment). Further, the presser tip portion 18 of the pressure applying plate spring 14 may be downwardly directed or arcuately curved and enclosed in an elastic body 28 of an optional shape, as shown in FIG. 11a (seventh embodiment) or FIG. 11b (eighth embodiment).

Figure 12:
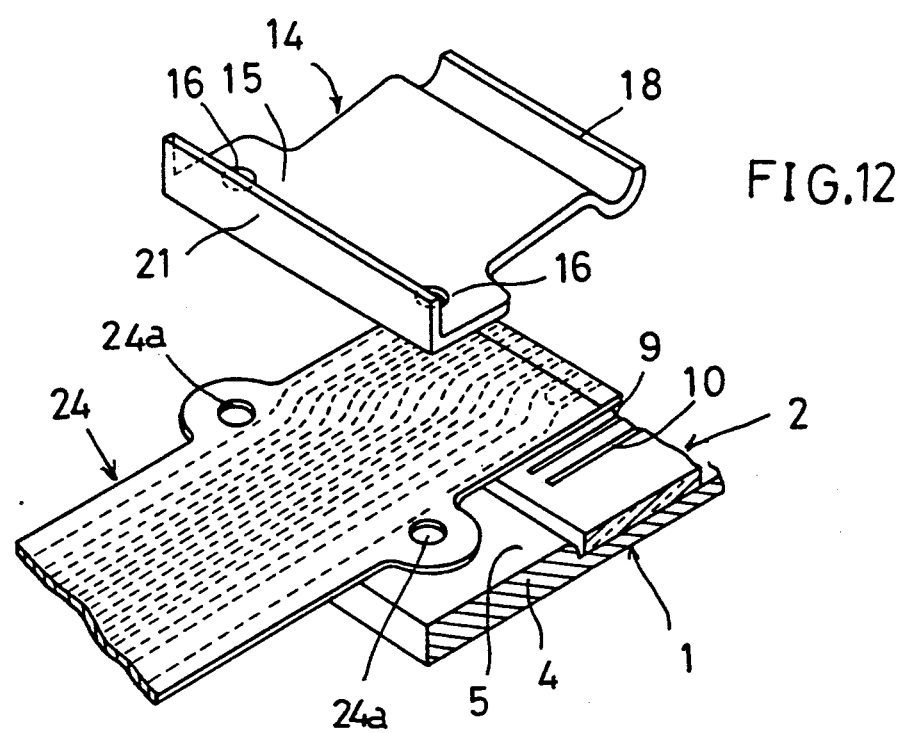
FIG. 12 is a perspective view showing a thermal print head according to a ninth embodiment of the invention.

FIG. 12 illustrates a thermal print head according to a ninth embodiment of the present invention. The thermal print head of this embodiment is similar to that of the first embodiment but differs therefrom only in that the band-like flexible cable 24 is directly connected to the head circuit board 2 without utilizing the flexible connector board 12 and the socket-type connector 23 (see FIG. 3). Thus, the pressure applying plate spring 14 is made to directly press the front end portion of the flexible cable 24 into contact with the head circuit board 2. For enabling fixation to the support member 1, the flexible cable 24 is formed with a pair of perforations 24a in corresponding relation to the mounting holes 16 of the plate spring 14.

Figure 13:
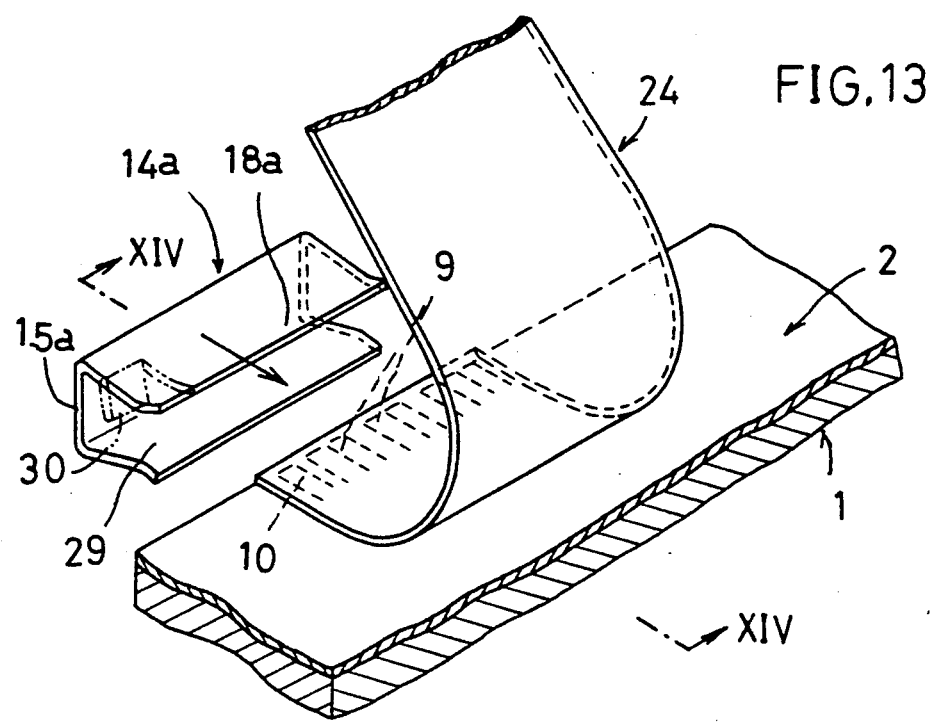
FIG. 13 is a perspective view showing a thermal print head according to a tenth embodiment of the invention.
Figure 14:
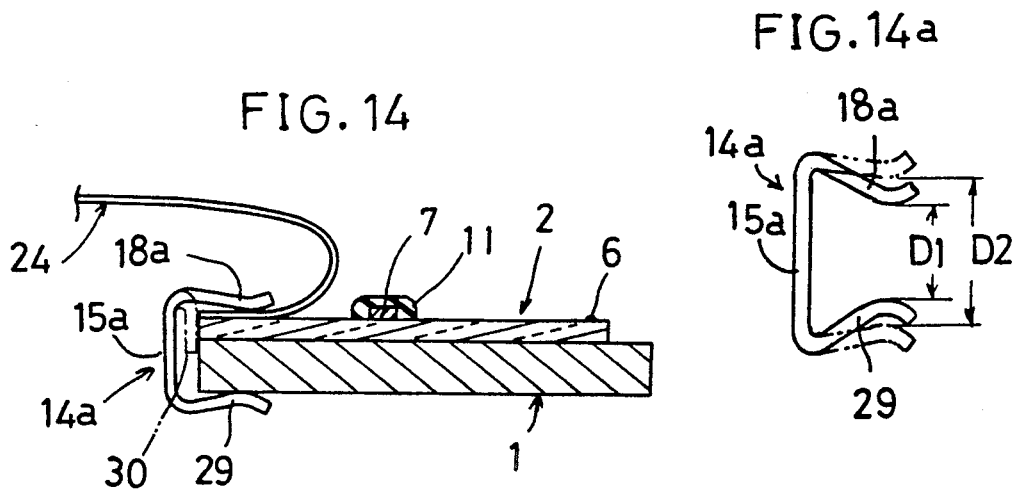
FIG. 14 is a sectional view taken along lines X—X in FIG. 13.
Figure 14A:
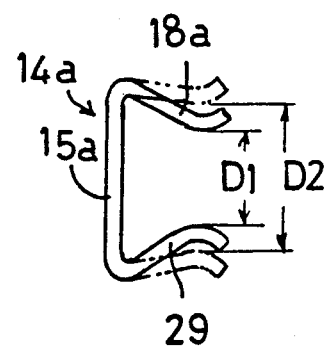
FIG. 14a is a side view showing a pressure applying clip incorporated in the thermal head of the tenth embodiment.

FIGS. 13 through 14a show a thermal print head according to a tenth embodiment of the present invention which is somewhat different from the foregoing embodiments.

According to the tenth embodiment, use is made of a pressure applying member 14a which is in the form of a clip or channel which is elastically mountable by its own clipping function. Thus, there is no need to use any separate fixing means such as bolts, and the support member 1 supporting the head circuit board 2 is not required to have an excess marginal portion (see reference numeral 4 in FIG. 1) for the provision of threaded holes (see reference numeral 20 in FIG. 1). As a result, the width of the support member 1 may be correspondingly reduced, as shown in FIGS. 13 and 14.

The pressure applying clip 14a, which can be regarded to constitute a plate spring as a whole, has a base or web portion 15a. The clip further has a presser portion 18a with a rounded tip for directly pressing the band-like flexible cable 24, and an anchoring portion 29 also with a rounded tip for engaging the underside of the support member 1. As shown in FIGS. 13 and 14, the front end portion of the flexible cable 24 is bent and turned over before being nipped by the clip 14a.

In natural state of the clip, the distance D1 (see FIG. 14a) between the presser portion 18a and the anchoring portion 29 is smaller than the combined thickness of the support member 1, head circuit board 2 and band-like flexible cable 24. However, when the clip is mounted for clipping, the distance between the presser portion 18a and the anchoring portion 29 increases to a value D2 corresponding to the combined thickness by elastic deformation of the clip, as indicated by phantom lines in FIG. 14a.

Obviously, the clip 14a thus mounted is capable of insuring substantially uniform contact between the flexible cable 24 and the head circuit board 2. Further, the clip 14a need only be fitted without using any bolts, so that it is possible to greatly reduce the time and labor required for mounting the clip in addition to reducing the required number of components.

Preferably, the presser portion 18a may be provided with a positioning stopper 30 which is formed by downwardly bending a part of the presser portion, as indicated by phantom lines in FIGS. 13 and 14. This stopper 30 comes into abutment with the support member at the time of fitting, thereby accurately positioning the clip 14a relative to the head circuit board 2 transversely thereof. Alternatively, the anchoring portion 29 may be provided with a similar positioning stopper (not shown) by upwardly bending a part of the anchoring portion.

Figure 15:
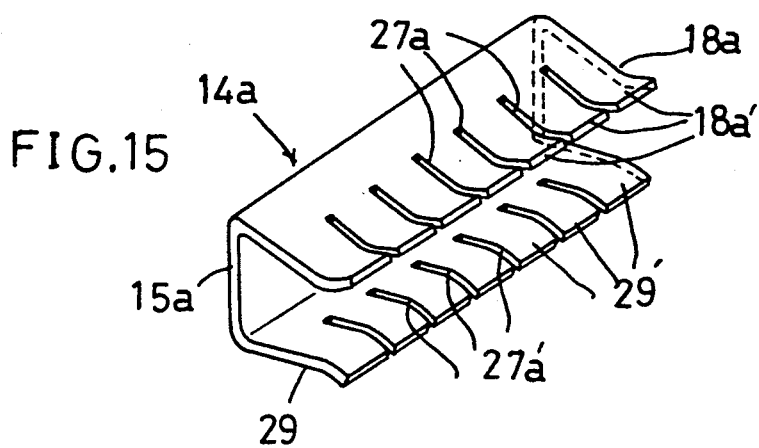
FIGS. 15 and 16 are perspective views each showing pressure applying clips according to eleventh and twelfth embodiments, respectively, of the present invention.

The presser portion 18a of the pressure applying clip 14a may be formed with a plurality of slits 27a for division into segments 18a', as shown in FIG. 15 (eleventh embodiment). The advantages obtainable by the provision of such slits are already described in connection with FIGS. 7 and 8. Similarly, the anchoring portion 29 may be formed with a plurality of slits 27a' for division into segments 29', as also shown in FIG. 15.

Figure 16:
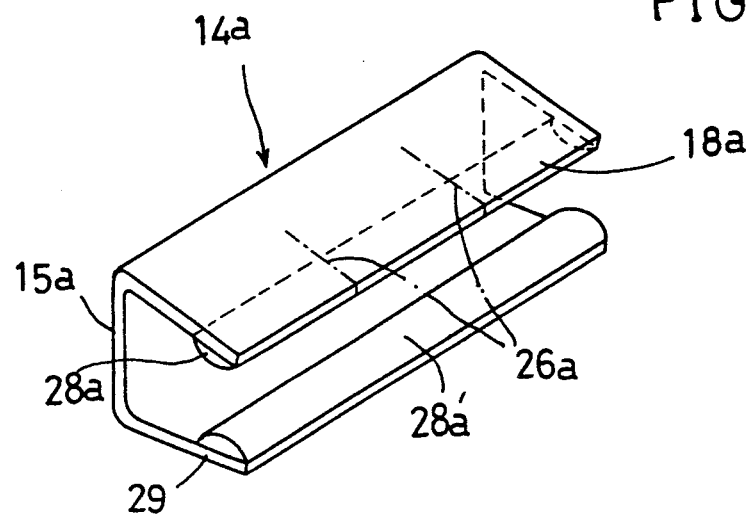

Further, the presser portion 18a of the pressure applying clip 14a may be provided with a relatively soft elastic body 28a which is made of rubber for example, as shown in FIG. 16 (twelfth embodiment). The elastic body 28a provides an advantage of preventing unexpected removal of the clip 14a due to increased frictional resistance in addition to the advantages which are already described in connection with FIG. 9. Similarly, the anchoring member 29 may also be provided with a relatively soft elastic body 28a'. Further, the presser member 18a may be formed with a plurality of cuts 26a for division into independently deformable segments.

Figure 17:
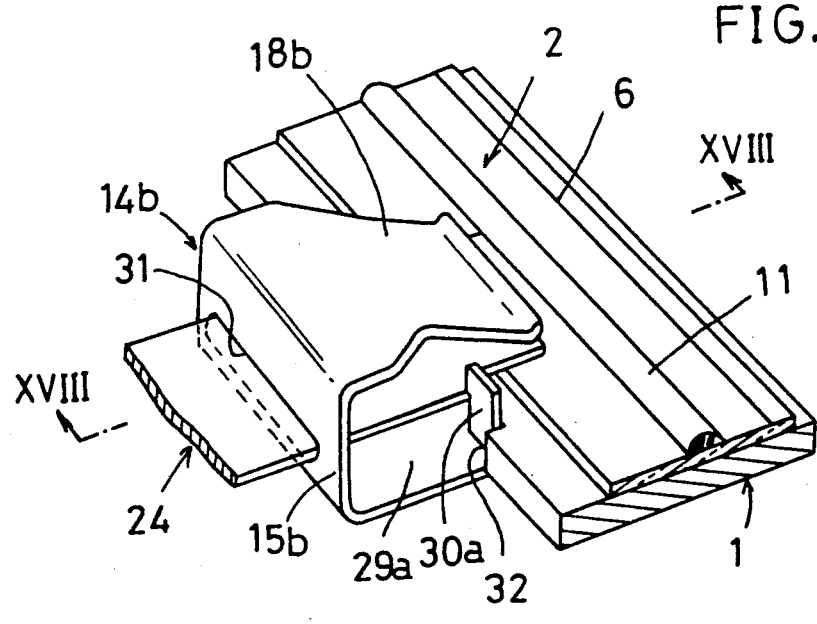
FIG. 17 is a perspective view showing a thermal print head according to a thirteenth embodiment of the invention.
Figure 18:
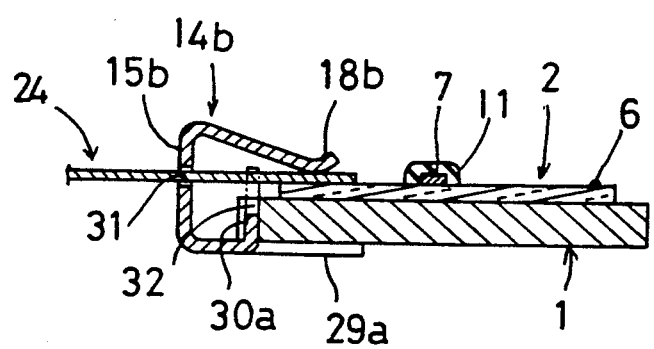
FIG. 18 is a sectional view taken along lines XVIII—XVIII in FIG. 17.
Figure 19:
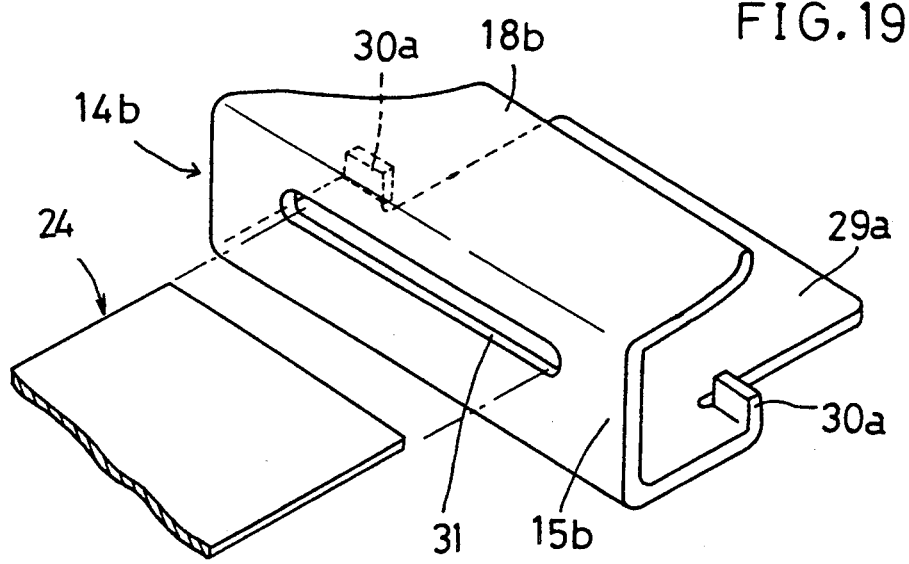
FIG. 19 is an enlarged perspective view showing a pressure applying clip incorporated in the thermal head of the thirteenth embodiment.

FIGS. 17 through 19 represent a thermal print head according to a thirteenth embodiment of the present invention. According to this embodiment, use is made of a modified pressure applying clip 14b which enables the band-like flexible 24 to be led to its clipped position from behind the clip.

Similarly to the twelfth embodiment, the modified pressure applying clip 14b has a base or web portion 15b, a presser portion 18b, and an anchoring portion 29a. The web portion 15b has an access opening 31 to allow entry, from behind, of the flexible cable 24 to its clipped position. If necessary, this access opening 31 may be utilized also for allowing entry of a flexible connector board (see reference numeral 12 in FIGS. 4 and 5 for example) for connection to the flexible cable 24.

Further, according to the thirteenth embodiment, the anchoring portion 29a is made to have a pair of positioning stoppers 30a which come into abutment with the support member 1 when the clip 14b is mounted suitably relative to the support member transversely thereof. Preferably, the support member 1 is formed with a positioning cutout 32 in which the stoppers 30a are fitted in for preventing positional deviation of the clip 14b longitudinally of the support member 1. It is further advantageous if the stoppers 30a have a sufficient height as to prevent positional deviation of the flexible cable 24 longitudinally of the support member 1, as shown in FIG. 17. It should be appreciated that the stoppers 30a are shown to have a smaller height in FIGS. 18 and 19 than in FIG. 17, such illustration being only for purposes of comparison.

Obviously, the presser portion 18b of the modified clip 14b may be formed with slits or cuts (see FIGS. 15 and 16). Further, each of the presser portion 18b and anchoring portion 29a may be provided with a relatively soft elastic member (see FIG. 16) to prevent damaging contact with a counterpart component.

Figure 20:
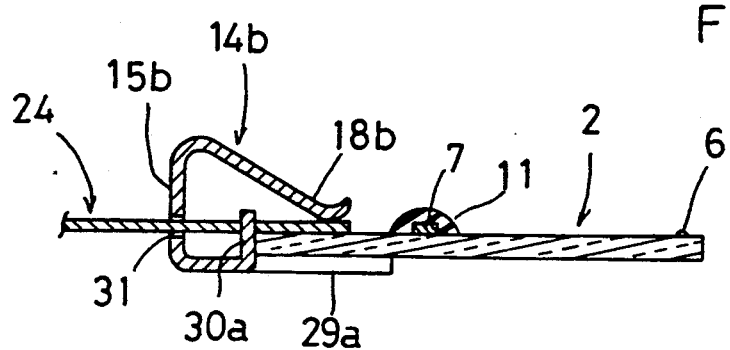
FIG. 20 is a sectional view similar to FIG. 18 but showing a thermal print head according to a fourteenth embodiment of the present invention.

FIG. 20 shows a thermal print head according to a fourteenth embodiment which is substantially identical to the thirteenth embodiment but differs therefrom only in that the anchoring portion 29a of the clip 14b is made to directly engage the underside of the head circuit board 2. Thus, no support member is used in the thermal print head of the fourteenth embodiment.

Obviously, the arrangement shown in FIG. 20 is simpler and requires a smaller number of components, consequently resulting in great reduction in cost and weight of the print head. It should be appreciated that a mounting plate (not shown), which is originally incorporated in a facsimile machine for example, may be utilized for supporting the head circuit board 2 and for dissipating the heat therefrom.

Figure 21:
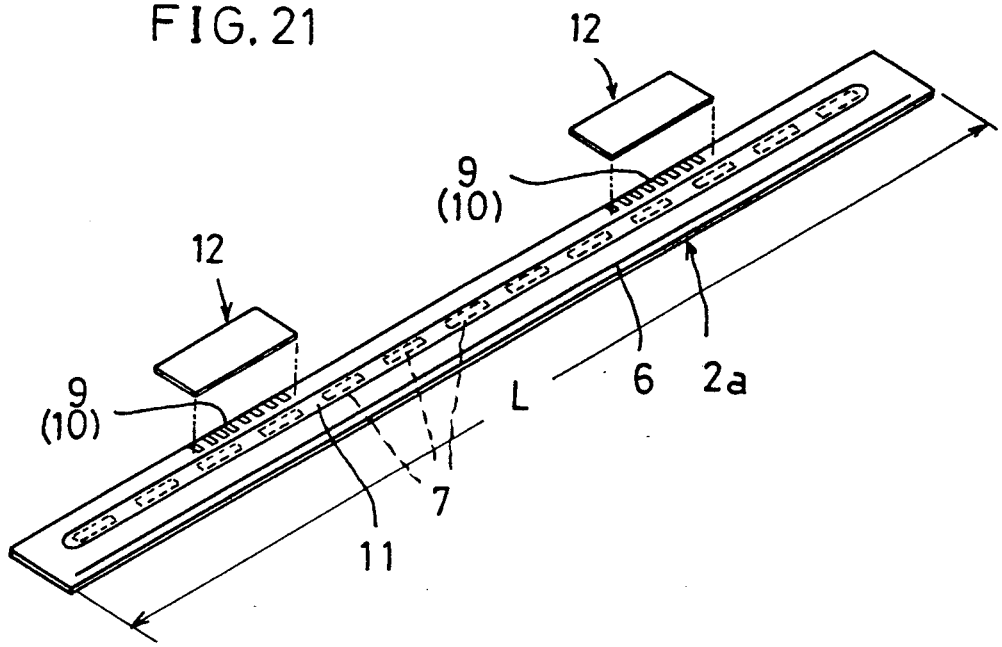
FIGS. 21 and 22 are perspective views each showing a modified head circuit board to which the present invention may be applied.
Figure 22:
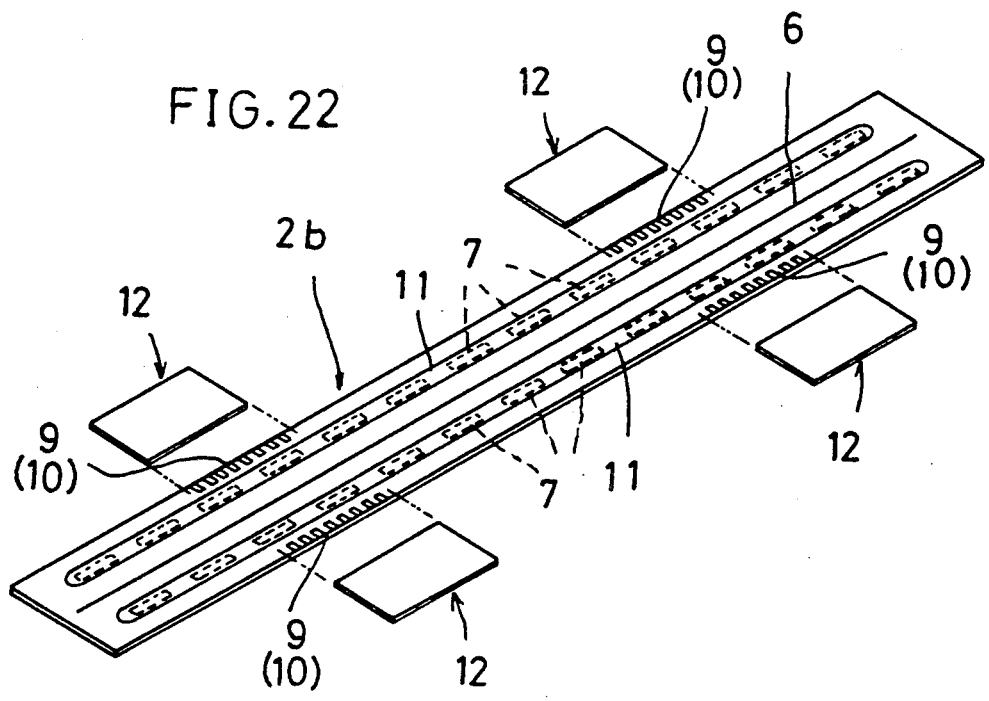

The pressure applying members 14, 14a, 14b according to the foregoing embodiments may be used in variously sized line-type thermal print heads. For instance, when the thermal print head includes a head circuit board 2a of a relatively large length L with two ore more groups of connection terminals 9, 10 positioned in different portions, it is only necessary to use two or more pressure applying members, as shown in FIG. 21. Further, when the thermal print head includes an extremely large-sized head circuit board 2b wherein the resistor line 6 is located substantially at a transverse center position with two arrays of drive IC's 7 and four or more groups of connection terminal 9, 10 arranged on both sides of the resistor line, it is only necessary to use four or more pressure applying members in corresponding relation of the respective groups of connection terminals, as shown in FIG. 22.

The invention being thus described, it is obvious that the same may be varied in many ways. Such variations are not to be regarded as a departure from the spirit and scope of the invention, and all such modifications as would be obvious to those skilled in the art are intended to be included within the scope of the following claims.

We claim:

1. A thermal print head comprising:
   a head circuit board formed with a resistor line and at least one array of drive elements, the head circuit board being further formed with connection terminals for the resistor line and the array of drive elements, the connection terminals being arranged locally at least in one region which is sufficiently smaller in length than the head circuit board;
   a flattened flexible member formed with a conductor pattern for electrical connection to the connection terminals of the head circuit board, the flexible member being partially overlapped on the head circuit board in said one region thereof; and
   a pressure applying member for pressing the flexible member into contact with the head circuit board in said one region thereof;
   wherein the pressure applying member comprises a plate spring having a presser portion which is elastically deformed for pressing, without intervention of a separate pressing member, the flexible member into contact with the head circuit board in said one region thereof by elastic restoring force of the spring, the presser portion of the plate spring being divided into segments which are deformable independently of each other.

2. The thermal print head according to claim 1, wherein the division of the presser portion of the plate spring is provided by cuts extending transversely of the head circuit board.

3. The thermal print head according to claim 1, wherein the division of the presser portion of the plate spring is provided by slits extending transversely of the head circuit board.

4. The thermal print head according to claim 1, wherein each of the independently deformable segments has a rounded tip for direct contact with the flexible member.

5. The thermal print head according to claim 1, wherein each of the independently deformable segments has a tip which is irremovably provided with a soft elastic body for contact with the flexible member.

6. The thermal print head according to claim 5, wherein the tip of said each independently deformable segment is enclosed in the elastic body.

7. The thermal print head according to claim 1, further comprising a support member on which the head circuit board is attached, the plate spring further having a base portion which is fixed to the support member by bolting.

8. The thermal print head according to claim 7, wherein the base portion of the plate spring is integrally formed with a reinforcing rib extending longitudinally of the head circuit board.

9. The thermal print head according to claim 1, wherein the plate spring comprises a channel-shaped clip having a web portion from which the presser portion integrally extends for coming into pressing contact with the flexible member, the clip further having an anchoring portion integrally extending from the web portion to be located on a side of the head circuit board away from the flexible member.

10. The thermal print head according to claim 9, further comprising a support member on which the head circuit board is attached, the anchoring portion of the clip being made to engage the support member on a side thereof away from the flexible member.

11. The thermal print head according to claim 1, wherein the array of drive elements is enclosed in a hard resin body, the presser portion of the plate spring being located clear of the resin body.

* * * * *